(12) United States Patent
Mazen et al.

(10) Patent No.: US 12,469,743 B2
(45) Date of Patent: Nov. 11, 2025

(54) METHOD FOR PREPARING A THIN LAYER THAT INCLUDES FORMING A WEAKENED ZONE IN A CENTRAL PORTION OF A DONOR SUBSTRATE THAT DOES NOT EXTEND INTO A PERIPHERAL PORTION OF THE DONOR SUBSTRATE AND INITIATING AND PROPAGATING A SPLITTING WAVE IN THE WEAKENED ZONE THAT DOES COMPLETELY NOT PROPAGATE THROUGH THE PERIPHERAL PORTION

(71) Applicants: Soitec, Bernin (FR); Commissariat À L'énergie Atomique Et Aux Énergies Alternatives, Paris (FR)

(72) Inventors: Frédéric Mazen, Grenoble (FR); François Rieutord, Grenoble (FR); Marianne Coig, Grenoble (FR); Helen Grampeix, Grenoble (FR); Didier Landru, Le Champ-près-Froges (FR); Oleg Kononchuk, Theys (FR); Nadia Ben Mohamed, Echirolles (FR)

(73) Assignees: Soitec, Bernin (FR); Commissariat À L'énergie Atomique Et Aux Énergies Alternatives, Paris (FR)

( * ) Notice: Subject to any disclaimer, the term of this patent is extended or adjusted under 35 U.S.C. 154(b) by 476 days.

(21) Appl. No.: 17/907,243

(22) PCT Filed: Jan. 19, 2021

(86) PCT No.: PCT/FR2021/050089
§ 371 (c)(1),
(2) Date: Sep. 23, 2022

(87) PCT Pub. No.: WO2021/191513
PCT Pub. Date: Sep. 30, 2021

(65) Prior Publication Data
US 2024/0030060 A1      Jan. 25, 2024

(30) Foreign Application Priority Data

Mar. 23, 2020  (FR) .................................... 2002811

(51) Int. Cl.
*H01L 21/324*   (2006.01)
*H01L 21/762*   (2006.01)

(52) U.S. Cl.
CPC .... *H01L 21/76254* (2013.01); *H01L 21/3247* (2013.01)

(58) Field of Classification Search
CPC .......... H01L 21/76254; H01L 21/3247; H01L 21/02002
See application file for complete search history.

(56) References Cited

U.S. PATENT DOCUMENTS

2005/0196936 A1    9/2005   Daval et al.
2018/0166622 A1*   6/2018   Akiyama ................ H01L 21/02
2019/0348319 A1   11/2019   Kononchuk et al.

FOREIGN PATENT DOCUMENTS

EP   1359615 B1   10/2008
EP   2933828 B1   10/2016
(Continued)

OTHER PUBLICATIONS

Japanese Official Notice of Rejection for Application No. 2022-557659 dated Oct. 1, 2024, 2 pages.
(Continued)

*Primary Examiner* — William B Partridge
*Assistant Examiner* — Erik A. Anderson
(74) *Attorney, Agent, or Firm* — TraskBritt

(57) ABSTRACT

A method for preparing a thin layer comprises a weakening step for forming a weakened zone in a central portion of a donor substrate, the weakened zone not extending into a peripheral portion of the donor substrate; a step of joining the main face of the donor substrate to a receiver substrate (Continued)

to form an assembly to be split; and a step of separating the assembly to be split, the separating step comprising a heat treatment resulting in the freeing of the thin layer from the donor substrate at the central portion thereof only. The method also comprises, after the separating step, a detaching step comprising the treating of the assembly to be split in order to detach the peripheral portion of the donor substrate from the receiver substrate.

20 Claims, 2 Drawing Sheets

(56) References Cited

FOREIGN PATENT DOCUMENTS

| FR | 2867307 | B1 | 5/2006 |
| FR | 3061988 | | 7/2018 |
| FR | 3063176 | A1 | 8/2018 |
| JP | 2007-526646 | A | 9/2007 |
| JP | 2012-186292 | A | 9/2012 |
| JP | 2014-043807 | A | 3/2014 |
| JP | 2020-504439 | A | 2/2020 |
| JP | 2020-507916 | A | 3/2020 |
| TW | 200423295 | A | 11/2004 |
| WO | WO-2009053355 | A1 * | 4/2009 ........... H01L 21/187 |

OTHER PUBLICATIONS

International Search Report for International Application No. PCT/FR2021/050089 dated Apr. 28, 2021, 5 pages.

International Written Opinion for International Application No. PCT/FR2021/050089 dated Apr. 28, 2021, 7 pages.

Massy et al., Crack Front Interaction with Self-Emitted Acoustic Waves, https://hal.archives-ouvertes.fr/hal-01935677, (Nov. 27, 2018), 7 pages.

Mazen et al., Fracture Dynamics in Implanted Silicon, Applied Physics Letters, vol. 107, https://www.researchgate.net/publication/282828417, (Aug. 2015), 7 pages.

* cited by examiner

METHOD FOR PREPARING A THIN LAYER THAT INCLUDES FORMING A WEAKENED ZONE IN A CENTRAL PORTION OF A DONOR SUBSTRATE THAT DOES NOT EXTEND INTO A PERIPHERAL PORTION OF THE DONOR SUBSTRATE AND INITIATING AND PROPAGATING A SPLITTING WAVE IN THE WEAKENED ZONE THAT DOES COMPLETELY NOT PROPAGATE THROUGH THE PERIPHERAL PORTION

CROSS-REFERENCE TO RELATED APPLICATIONS

This application is a national phase entry under 35 U.S.C. § 371 of International Patent Application PCT/FR2021/050089, filed Jan. 19, 2021, designating the United States of America and published as International Patent Publication WO 2021/191513 A1 on Sep. 30, 2021, which claims the benefit under Article 8 of the Patent Cooperation Treaty to French Patent Application Serial No. FR2002811, filed Mar. 23, 2020.

TECHNICAL FIELD

The present disclosure relates to a process for preparing a thin layer transferred to a carrier substrate through application of the SMARTCUT™ technology.

BACKGROUND

In some implementations of the SMARTCUT™ technology, a thin layer is prepared by introducing light species through a main face of a donor substrate in order to form a buried weakened zone. In this way, the thin layer is defined, in this donor substrate, between the buried weakened zone and the main face of the substrate. Then, the donor substrate is joined to a second substrate, called the "receiver" substrate, and a separating heat treatment is applied to this assembly, potentially assisted by mechanical stress, in order to bring about the initiation and propagation of a splitting wave at the buried weakened zone in order to free the thin layer, which is thus transferred to the receiver substrate.

The effect of the separating heat treatment is to promote the growth and the pressurization of microcavities, the development of which is due to the presence of the light species in the weakened zone. This effect is the source of the initiation and propagation of the splitting wave resulting in freeing of the thin layer.

The state of the exposed surface of the thin layer transferred to the receiver substrate is irregular, which is generally not entirely satisfactory. A process implementing the SMARTCUT technology therefore generally involves an additional, finishing step with a view to decreasing these surface irregularities. This may mean treating the exposed surface of the thin layer, over this finishing step, by chemical-mechanical polishing or by annealing at high temperature, typically on the order of 1100° C., while exposing it to a reducing or neutral atmosphere.

Document FR3061988 proposes a process for finishing a thin layer prepared using the SMARTCUT technology, as set out above. This document proposes applying a heat treatment of moderate amplitude to the thin layer, lower than 950° C. and in a reducing or neutral atmosphere, directly after it has been freed from the donor substrate. Since the free surface of the thin layer has not been exposed to the ambient atmosphere, it is not oxidized and the atoms of which it is formed are highly mobile so as to reorganize themselves and smooth the surface. This heat treatment is therefore particularly effective, even at relatively low temperature, for smoothing the freed surface of the thin layer. It should be noted that in the process presented in FR3061988, the splitting and smoothing treatments have to be carried out without contact with the ambient atmosphere between the two steps, i.e., in the same apparatus. This imposes extreme constraints in terms of heat capacities and control of the purity of the atmosphere in the apparatus.

Document FR2876307 provides a similar heat treatment, directly after the thin layer has been freed from the donor substrate.

Document EP2933828 indicates that the surface irregularities are the result of several phenomena of different natures in combination. These irregularities may correspond to the traces of the microcavities that led to the splitting of the donor substrate. They contribute to forming a roughness at the surface of the thin layer, the amplitude and the wavelength of which are on the order of one nanometer to tens of nanometers.

The irregularities may also originate in the interaction between the propagation of the splitting wave and acoustic vibrations encountered in the assembly to be split at the moment of splitting. These vibrations are caused by the sudden release of energy in the splitting of the thin layer. The splitting wave is then liable to be deflected vertically from its plane of progression depending on the instantaneous state of stress of the material through which it is moving. Reference may be made to the article "Crack Front Interaction with Self-Emitted Acoustic Waves," Physical Review Letters, American Physical Society, 2018, 121. (19), pp. 195501, for a detailed analysis of this mechanism. The irregularities caused by this phenomenon are relatively large in size, and constitute a non-uniformity in the thickness of the thin layer, the amplitude of which may be on the order of a nanometer and the wavelength of which on the order of a millimeter, or even a centimeter.

Additionally, and as documented in the publication by Massy et al. "Fracture dynamics in implanted silicon," *Applied Physics Letters* 107.9 (2015), the sudden release of energy, the oscillations and the hitting of the two substrates caused during the splitting may also result in damage to the separated surfaces. This damage may, in particular, be caused by impacts between these two surfaces or their relative movements.

More generally, the handling of the carrier substrate bearing the thin layer and remainder of the donor substrate, after the weakening step and after these two parts have been separated from one another, may also cause damage, for example, scratches or particles, on the freed surface of the thin layer.

It is difficult to remove surface irregularities from the thin layer, apart from those in the form of roughness, using just a heat treatment. Specifically, the dimensions of these irregularities may exceed the mean distance of mobility, under the effect of the heat treatment, of the atoms forming this surface. This is, in particular, the case in the smoothing process proposed by document FR3061988 cited above.

Consequently, a thin layer prepared using a process of the prior art may have a damaged or imperfect surface state, from which it has not been possible to remove all of the irregularities.

The present disclosure seeks to at least partly overcome the above-mentioned limitations of the prior art.

BRIEF SUMMARY

With a view to achieving this aim, the subject of the present disclosure relates to a process for preparing a thin layer comprising the following steps:
- a weakening step comprising the introduction of light species through a main face of a donor substrate, the step aiming to form a weakened zone in a central portion of the donor substrate in order to define the thin layer with the main face of the donor substrate, the weakened zone not extending into a peripheral portion of the donor substrate;
- a step of joining the main face of the donor substrate to a receiver substrate in order to form an assembly to be split, the central portion and the peripheral portion of the main face of the donor substrate being brought into contact with a face of the receiver substrate;

According to the present disclosure, the process also comprises:
- a step of separating the assembly to be split, the separating step comprising a heat treatment resulting in the initiation and propagation of a splitting wave in the weakened zone in order to free the thin layer from the donor substrate at the central portion thereof only, the splitting wave not propagating completely through the peripheral portion such that the donor substrate and the receiver substrate remain attached to one another at the peripheral portion of the donor substrate;
- a detaching step, distinct from the separating step and applied after this step, the detaching step comprising the treating of the assembly to be split in order to detach the peripheral portion of the donor substrate (2) from the receiver substrate (5) and thus transfer the thin layer (1) to the receiver substrate (5).

By localizing the weakened zone to the central portion only of the donor substrate, it is possible to free the thin layer without causing the complete detachment of the donor substrate and the receiver substrate, which makes it possible to improve the surface state of this thin layer.

According to other advantageous and non-limiting features of the present disclosure, taken alone or in any technically feasible combination:
- the process comprises a finishing step, this step comprising a heat treatment aiming to bring the assembly to be split to a temperature higher than the temperature of the heat treatment of the separating step in order to smooth the freed surface of the thin layer;
- the finishing step is applied between the separating step (S4) and the detaching step;
- the finishing step implements a heat treatment exposing the donor substrate to a temperature lower than 1000° C., lower than 950° C., lower than 900° C., or even lower than 600° C.;
- the separating step and the finishing step are carried out in one and the same apparatus;
- the separating step and the finishing step are carried out in distinct apparatuses;
- the finishing step is applied after the detaching step;
- the donor substrate is a wafer of circular shape and the peripheral portion is an annular portion, the width of which taken from the edge of the substrate is between 1 mm and 5 cm;
- the donor substrate comprises a peripheral chamfer on its main-face side, and the peripheral portion extends from the chamfer over a width of between 1 mm and 5 cm;
- the light species are chosen from the group consisting of hydrogen and helium;
- the donor substrate is made of monocrystalline silicon;
- the separating step implements a heat treatment exposing the donor substrate to a temperature of between 250° C. and 500° C.;
- the detaching step is performed by chemical etching or by applying a mechanical force to separate the carrier substrate and the donor substrate.

BRIEF DESCRIPTION OF THE DRAWINGS

Further features and advantages of the present disclosure will become apparent from the following detailed description of example embodiments of the present disclosure, with reference to the accompanying figures, in which.

DETAILED DESCRIPTION

Figure 1:
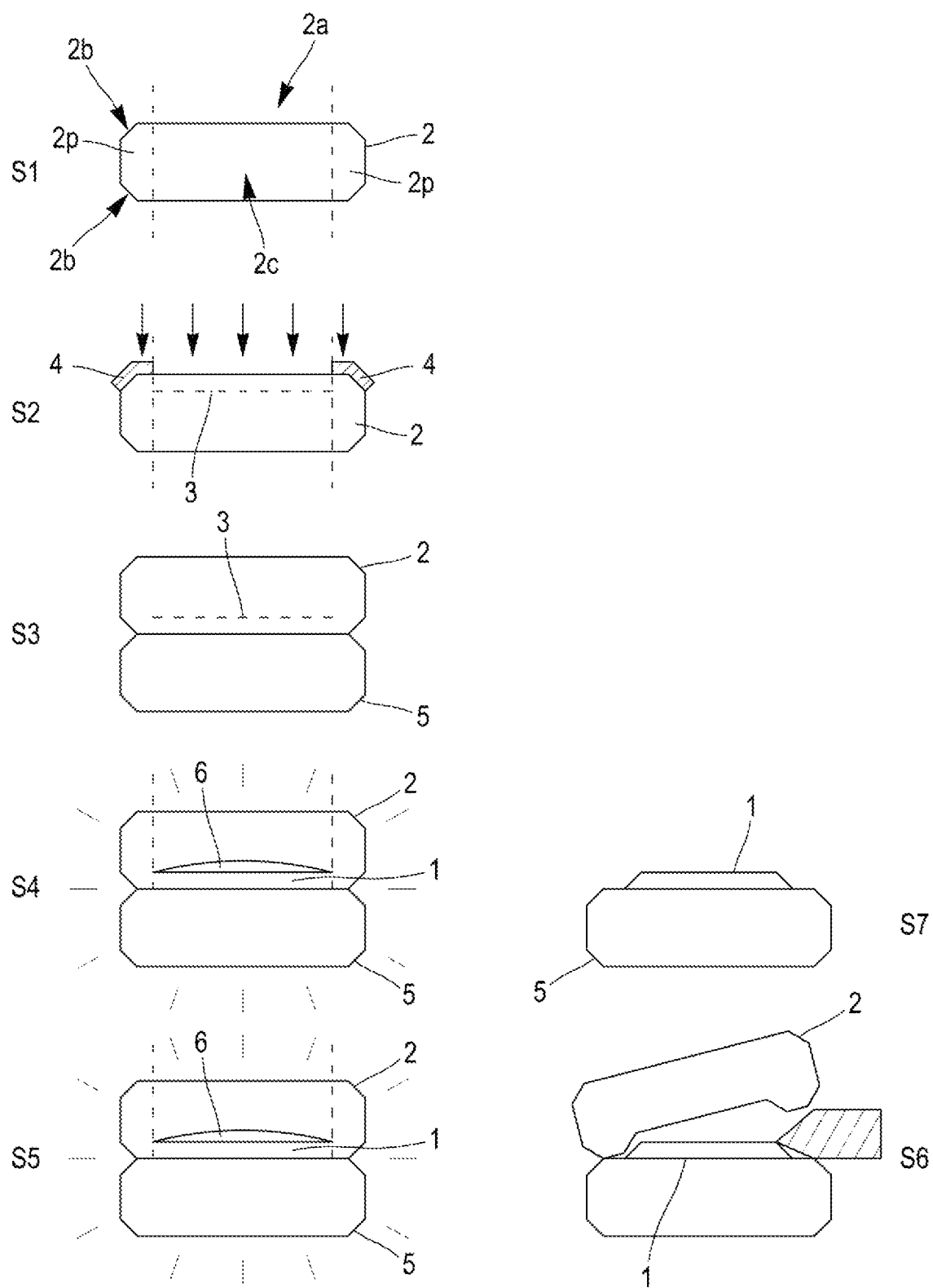
FIG. 1 shows the steps of a process according to the present disclosure.

With reference to FIG. 1, a process for preparing a thin layer 1 according to the present description is now presented.

This process comprises providing, in a preliminary step S1, a donor substrate 2, this substrate having a main face 2a. The donor substrate 2 may consist of a wafer of monocrystalline silicon, in particular, in the case that the process for preparing the thin layer aims to produce a silicon-on-insulator substrate. This wafer may have undergone prior treatments, such as an oxidation treatment, the formation of a surface layer by epitaxy or by deposition or any other surface preparation step.

The present disclosure is however in no way limited to a donor substrate 2 consisting of a silicon wafer, and the nature and shape of this substrate may be chosen freely according to the target application. It may thus be a substrate comprising any monocrystalline semiconductor material, for example, silicon carbide or germanium. It may also be an insulating material such as a piezoelectric material, such as lithium tantalate or lithium niobate. The donor substrate may thus take the shape of a circular wafer, of any diameter, from a few tens of millimeters to 300 mm or 450 mm or more. It may take another shape, such as square or rectangular. As specified above, the donor substrate 2 may have undergone prior steps of polishing, of deposition, of oxidation, etc., and therefore be formed of a stack of heterogeneous layers.

The donor substrate 2 may have a chamfered edge 2b as is common practice in the field of semiconductor wafers in order to prevent chipping thereof during handling. The chamfer 2b may extend over several millimeters at the periphery of the substrate.

Figure 2:
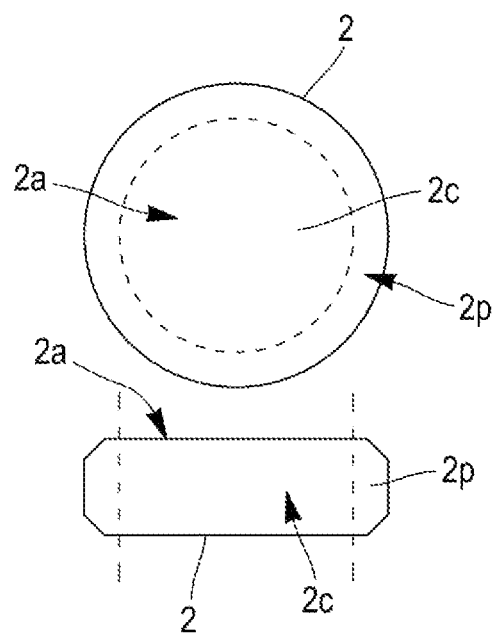
FIG. 2 shows the central portion and the peripheral portion of a donor substrate.

As shown in FIG. 2, a distinction is made in a donor substrate 2 according to the present description between two portions: a central portion 2c and a peripheral portion 2p. These portions 2c, 2p extend from one face to the other of the substrate and are projected onto the main face 2a of the substrate with any shape, as long as the peripheral portion 2p completely surrounds the central portion 2c. The central portion 2c may thus be projected, as shown in FIG. 2, onto the main face 2a of a donor substrate 2 (here in the shape of a circular wafer) so to as form a disc, centered on this face, and the peripheral portion 2p so as to form an annular surface, concentric with the disc defining the central portion 2c, and extending up to the edge of the donor substrate 2. The central portion 2c and the peripheral portion 2p are intended to be brought into contact with a receiver substrate, so as to join the two substrates to one another. When the donor substrate 2 has a chamfer 2b, the peripheral portion 2p therefore extends radially from the edge of the substrate toward its center, beyond this chamfer, in order to allow this contact.

By way of example, the peripheral portion 2p of the donor substrate 2 may have a width of between 1 mm and several centimeters, for example, 5 cm, taken from the edge of the chamfer when this chamfer is present, or from the edge of the substrate otherwise. Thus, in the case of the example shown in FIG. 2, in which the donor substrate 2 is a circular wafer having a chamfer with a width of approximately 1 mm at its outer edge, the peripheral portion 2p is defined as an annular portion, the width of which taken from the inner edge of the chamfer is between 1 mm and 5 cm, such that this peripheral zone may come into contact with a receiver substrate having at least the same size. The portion arranged inside the annular portion forms the central portion 2c of the donor substrate 2.

Pursuant to the description of FIG. 1, a process according to the present description comprises a weakening step S2 comprising the introduction of light species through a main face 2a of a donor substrate 2. This step aims to form a weakened zone 3 buried in the donor substrate 2. The weakened zone 3 extends in a plane of the donor substrate 2 that is essentially parallel to the main face 2a of this donor substrate 2. The weakened zone 3 defines, with the main face 2a of the donor substrate 2, at least part of the thin layer 1 that is sought to be prepared. As is well known per se, the light species are typically chosen from the list formed of hydrogen and helium, without this being limiting. These light species are generally introduced into the donor substrate 2 by ion implantation, although other methods of introduction are also possible (by plasma, by diffusion). In the case of implantation, the implantation energy defines the depth to which the ions penetrate into the material of the donor substrate 2, and therefore the depth of the buried plane in which the weakened zone 3 is located.

When the introduction is performed by ion implantation, it is possible to envisage this introduction being performed in a single step, for example, for implanting a single dose of hydrogen or a single dose of helium, or in a plurality of successive steps, for example, for implanting a dose of hydrogen followed by another dose, of helium. Whatever the nature and the way in which the species are introduced into the donor substrate, the term "dose" will refer to the total quantity of species introduced into a unit area of the donor substrate, for example, the number of light species implanted per cm^2.

In the context of the present description, the weakening step S2 is carried out such that, upon completion of this step, the weakened zone 3 is localized to the central portion 2c of the donor substrate 2 and does not extend into the peripheral portion 2p. As will be made clear in the rest of this description, by localizing the weakened zone to the central portion 2c only, it will be possible to free the thin layer without causing the complete detachment of the donor substrate and the receiver substrate to which the donor substrate will be joined, which makes it possible to improve the surface state of this thin layer.

A number of approaches are possible for localizing the weakened zone 3 to the central portion 2c only. Thus, and according to a first approach, the weakening step S2 is carried out by differentiating the dose introduced into the central portion 2c from that introduced into the peripheral portion 2p. Reference may be made in this regard to application FR3063176.

The weakening step S2 may thus comprise the introduction of a first dose of light species into the central portion 2c of the donor substrate 2 and the introduction of a second dose of light species, lower than the first dose, into the peripheral portion 2p of this donor substrate 2.

The first dose of light species is chosen so that it is sufficient, in a later step of separation S4, to free the thin layer 1 from the donor substrate at the weakened zone arranged in the central portion 2c. This dose therefore results in the formation of the weakened zone 3 in the central zone 2c. The second dose of light species introduced into the peripheral portion 2p is then chosen so that it does not allow this detachment in the peripheral portion 2p. This dose therefore does not result in the formation of a weakened zone in the sense of the present description. To be completely clear, the peripheral portion 2p of the donor substrate 2 may comprise light species, implanted or introduced in any other way, but these species are not present at sufficient concentration in this portion 2p to form a weakened zone in the sense of the present disclosure, and it may, in particular, not cause the separation of the donor substrate 2 at this portion 2p.

By way of example, and according to one preferred implementation, which is shown in FIG. 1, the second dose of light species may be zero, and in this case the light species are introduced only into the central portion 2c of the donor substrate 2 and not into the peripheral portion 2p.

To achieve this, it is possible to mask the peripheral portion 2p using a shielding material forming a barrier to the penetration of the light species, when the introduction of these species is performed by ion implantation. This mask may be made of Teflon, of aluminum or of carbon. It may also be formed of a sacrificial mask 4 made of resin, of hard oxide or of nitride arranged at the peripheral portion 2p of the main face 2a of the donor substrate 2 at least, it being understood that this mask will be removed upon completion of this weakening step S2.

When the weakening step S2 envisages a plurality of successive phases of ion implantation, as is the case with co-implantation of hydrogen and helium, the mask may be present during only some of the phases of implantation.

According to one variant of this first approach, the introduction of the light species into the donor substrate 2 may be performed by scanning a beam comprising such light species over the main face 2a of the donor substrate 2. In such an implementation of the weakening step S2, the motion of the beam may be controlled such that the peripheral portion 2p of the donor substrate 2 is excluded from any implantation or that the dose of species introduced into this portion 2p is smaller than the dose of species introduced into the central portion 2c. Therefore, in this variant, the mask may be omitted, which is advantageous.

The nature of the species and the exact doses of these species introduced into the central portion 2c and into the peripheral portion 2p are chosen according to the nature of the donor substrate and according to the features of the later step of separation S4.

By way of example, when the donor substrate 2 is made of monocrystalline silicon, and the separating step implements a heat treatment exposing the donor substrate 2 to a temperature of between 250° C. and 500° C., the following conditions can be envisaged:

Hydrogen only
Central portion: between 4E16 and 1E17 at/cm$^2$
Peripheral portion: between 0 and 3E16 at/cm$^2$
Hydrogen and helium
Central portion: H: between 0.5E16 and 2E16 at/cm$^2$; He between 0.5E16 and 2E16 at/cm$^2$.
Peripheral portion: H: between 0 and 1E16 at/cm$^2$; He between 0.5E16 and 2E16 at/cm$^2$.

According to an alternative approach, the weakening step S2 may comprise the introduction, during a first sub-step, of one and the same dose of light species into the central portion 2c of the donor substrate 2 and into the peripheral portion 2p of this donor substrate 2. This conventional dose, for example, of the order of 5E16 at/cm^2 of hydrogen when the donor substrate 2 is made of silicon, is sufficient to form a weakened zone 3 extending in the central zone 2c and into the peripheral zone 2p. In a second sub-step, the peripheral portion 2p of the donor substrate 2 is treated to render the light species introduced into the peripheral portion 2p ineffective. This may involve treating this peripheral portion, for example, using a laser, in order to diffuse the light species previously introduced into this zone, and effectively remove the weakened zone 3 from this peripheral portion 2p. Alternatively, the peripheral portion may be treated in order to damage the weakened zone present in this portion, for example, by implanting relatively heavy species, such as silicon species. Upon completion of the treatment performed in this second sub-step, the weakened zone 3 is localized only to the central zone 2c of the donor substrate 2, and no longer extends into the peripheral zone 2p.

Whatever the way in which this weakening step S2 has been implemented, what results therefrom is a donor substrate 2 comprising a buried weakened zone 3 localized to a central portion 2c of the donor substrate 2, the weakened zone 3 defining, with the main face 2a of the donor substrate 2, the thin layer 1, and the weakened zone 3 not extending into the peripheral portion 2p.

In a subsequent step of joining S3 of a process according to the present description, the donor substrate thus prepared is joined to a receiver substrate 5 by bringing the main face 2a of the donor substrate 2 into contact with a face of the receiver substrate 5. The receiver substrate 5 may be of any nature and of any shape required as long as it has a face of sufficient size to be brought into contact with the central portion 2c and at least part of the peripheral portion 2p of the donor substrate 2.

This joining operation may be performed by any method, for example, by molecular adhesion, by applying an adhesive material to at least one of the faces to be joined, or by eutectic bonding when the faces to be joined have been prepared beforehand so as to have a metal surface. The joining step S3 may also envisage conditioning the faces of the two substrates, by cleaning, activation or any other preparation step, in order to facilitate this joining operation and fix the two substrates to one another with sufficient adhesion energy.

Alternatively, the joining operation may consist in gradually forming the receiver substrate 5 by depositing, at moderate temperature, the constituent material of the receiver substrate 5 on the main face 2a of the donor substrate 2.

The term "assembly to be split" will be used in the rest of this description to refer to the assembly formed of the donor substrate 2 and of the receiver substrate 5 upon completion of this step S3.

In a next step of a process according to the present description, the assembly to be split is heat-treated during a separating step S4. The heat treatment causes the development of microcavities, the coalescence of these microcavities when they are sufficient in number and their pressurization via the available light species, as is conventional in the implementation of the SMARTCUT technology. As mentioned previously, the buried weakened zone 3 does not however extend over the entire extent of the donor substrate 2. The heat treatment therefore leads to the freeing of the thin layer 1 from the donor substrate 2 at its central zone 2c only, and not at the peripheral zone 2p.

The heat treatment of the separating step S4, typically of between 200° C. and 500° C. when the donor substrate 2 is made of silicon, may be applied by placing the assembly to be split in a conventional oven for a duration that may be between several minutes and several hours. Practically, and for productivity reasons, a large number of assemblies to be split are typically arranged in a cassette, and this cassette is placed a high-capacity oven or stove in order to collectively apply the heat treatment to the assemblies to be split, at the chosen temperature and for the chosen duration.

The splitting wave that is initiated in this separating step S4 does not propagate from one end to the other of the donor substrate 2, and the remainder of the donor substrate (i.e., the donor substrate from which the thin layer has been taken) is not suddenly freed from the receiver substrate, as is the case with the separating steps of the prior art. In particular, the splitting wave does not propagate completely into the peripheral portion 2p of the donor substrate 2, which therefore remains securely joined to the receiver substrate 5 at this portion 2p. In the context of the process described with reference to FIG. 1, the receiver substrate 5 and the donor substrate 2 therefore remain joined to one another upon completion of the separating step S4, even though the thin layer 1 has been effectively freed. In the process of the present description, the generation of acoustic waves, oscillations and hitting of these substrates are therefore limited. The adverse interactions between the splitting wave and acoustic waves are decreased or eliminated, and impacts or sliding of the substrates are also prevented, which lead, in the processes of the prior art, to the creation of irregularities or damage at the surface of the thin layer, which is difficult to decrease just by applying a heat treatment.

It should be noted that the feature of the process according to which the splitting wave does not propagate completely into the peripheral portion 2p of the donor substrate 2 (and therefore the carrier substrate and the receiver substrate remain joined to one another) is entirely verifiable, since, in this case, it is not possible to remove the remainder of the donor substrate from the receiver substrate, i.e., to separate them from one another. This entirely verifiable character of this feature allows a person skilled in the art, using a few straightforward experiments and together with the examples provided in the present description, to determine the parameters of the steps of the process, in particular, the extent of the peripheral zone, the doses of light species to be introduced into the central zone and into the peripheral zone, respectively, the intensity of the heat treatment in separating step S4, etc.

The space 6 between the freed surfaces of the thin layer 1 and of the donor substrate 2 is filled with the light species that led to the freeing of the thin layer 1. These species are confined to this enclosed and sealed space 6, since the split did not propagate into the peripheral portion 2p of the donor substrate 2, which therefore remains securely joined to the receiver substrate 5. This enclosed and sealed space 6 is therefore also isolated from the surrounding atmosphere by the peripheral portion 2p of the donor substrate 2. Thus, external contaminants, for example, oxygen, are prevented from penetrating into this space 6 and passivating the freed surface of the thin layer 1, which would make it more difficult to smooth. It should be noted in this regard that the light species introduced during the weakening step S2, which allow the splitting of the donor substrate 2 (typically hydrogen or helium) are extremely pure, and they do not interact with the atoms forming the freed surface of the thin layer so as to passivate it and limit the surface mobility of the atoms, which creates an atmosphere that is particularly suitable for thermal smoothing.

To take advantage of this very particular state of the assembly to be split following the separating step S4, one preferred implementation of a process according to the present description envisages applying, during a finishing step S5, a heat treatment aiming to bring the assembly to be split to a temperature higher than the temperature of the heat treatment of the separating step S4, in order to smooth the freed surface of the thin layer 1.

In this preferred implementation, the heat treatment exposes the assembly to be split to a plateau temperature higher than the temperature, of between 200° C. and 500° C. when the donor substrate is made of silicon, of the separating step S4. Advantageously, this heat treatment remains moderate, lower than 1000° C., or 950° C., or even lower than 900° C. or 600° C. It may last for a duration of between a few seconds at the chosen plateau temperature and several hours at this plateau temperature.

This heat treatment of the finishing step S5 causes the assembly to be split to be brought to the treatment temperature, including the light species confined to the enclosed space 6 delimited by the freed surfaces of the thin layer 1 and of the donor substrate 2. These surfaces which are uncontaminated with reactive species from the outside atmosphere, for example, are composed of atoms that the temperature increase makes highly mobile, which makes it possible to smooth the surfaces, in particular, the free surface of the thin layer 1, in a highly effective manner, even at a low temperature, lower than or equal to 1000° C. or 950° C. It should be noted that this treatment of the assembly to be split may be implemented in an apparatus comprising any atmosphere, since it is not this atmosphere, which contributes to the smoothing of the surface of the thin layer 1. This apparatus, for example, a stove, aims only to raise the temperature of the assembly to be split.

Experiments have thus shown that it is possible to obtain, after a heat treatment of the finishing step S5 that involves exposing the assembly to be split to 950° C. for 2 minutes, a thin layer 1 of silicon having a surface the roughness of which is of the order of 1.6 nm RMS. In the absence of any finishing step, and therefore of any heat treatment of higher temperature than the temperature reached during the separating step S4, the roughness of the thin layer was measured at 5.5 nm RMS. The effectiveness of the finishing step that has just been described is clearly apparent.

The finishing step S5 may be carried out in the same apparatus as that used for the separating step S4, for example, the same oven or the same stove. However, in contrast to the solution of the prior art summarized in the introduction of present disclosure, it is also possible to perform the finishing step S5 in another apparatus, distinct from the apparatus used for carrying out the separating step S4. Specifically, the two substrates forming the assembly to be split are still attached to one another, and the risk of damaging the thin layer 1 during handling of this assembly in order to store it or move it to another apparatus is decreased. Additionally, since the free surface of the thin layer 1 is completely confined, it cannot be exposed to the ambient atmosphere during this change of apparatus. It is therefore not oxidized or passivated, and all of its potential for smoothing, even at low temperature, is retained when carrying out the finishing step in an environment other than that used in the separating step. Furthermore, as mentioned previously, the apparatus in which the finishing step S5 is carried out in this implementation may be chosen very freely.

In a subsequent step, the assembly to be split undergoes a detaching step S6 aiming to detach the donor substrate 2 (or more precisely the remainder of this donor substrate 2, after the thin layer 1 has been removed therefrom) from the receiver substrate 5 and thus finalize the transfer of the thin layer 1 to the receiver substrate 5. It should be noted that this detaching step S6 is clearly distinct from the separating step S4. Indeed, one highly advantageous feature of the process of the present description is that of clearly differentiating the propagation of the splitting wave, which is caused in the separating step S4 and which results in the freeing of the thin layer 1 from this detaching step S5, which results in the donor substrate being fully detached from the receiver substrate. In a conventional splitting step of the prior art, the propagation of the splitting wave propagates completely through the plane of the donor substrate, detaching the donor substrate from the receiver substrate in this single step.

The treatment implemented to obtain detachment during step S6 may vary: it may involve chemically etching, for example, wet etching, the edge of the assembly to be split in order to detach the two substrates at their joining interface. For this, the assembly to be split may be positioned vertically in order to dip a portion of its edge into a solution of KOH or of TMAH (when the donor substrate is made of silicon) or into a solution comprising HF when a layer of silicon oxide is present at the interface between the donor substrate 2 and the receiver substrate 5. By rotating the assembly, it is successively treated all the way around in order to detach the two substrates from one another. Alternatively, and as shown schematically in FIG. 1, this treatment may comprise applying a blade at the joining interface, and inserting it between the two substrates in order to cause the separation of the assembly. More generally, it may involve applying any means or any force resulting in the detachment of the carrier substrate 5 and the donor substrate 2 at their contact faces.

In any case, this detaching step S6 may be perfectly controlled, unlike the splitting step of a process of the prior art, such that the risk of damaging the thin layer 1 may be minimized.

According to another implementation, the finishing step is not carried out directly after the separating step S4, between this step S4 and the detaching step S6, but after the detaching step S6.

The finishing step S5 of this implementation may be a conventional finishing step, for example, exposing the freed surface of the thin layer 1, when it is made of silicon, to a reducing or neutral atmosphere at a temperature of between 950 or 1000° C. and 1100° C. More generally, the exposed surface of the thin layer will be subjected to a neutral or reducing atmosphere brought to a temperature higher than the temperature of the heat treatment of the separating step.

In this implementation, advantage is taken of the absence or minor presence of irregularities of large size or of damage at the surface of the thin layer 1. The roughness exhibited by this thin layer 1 may be smoothed effectively via the heat treatment described above.

Upon completion of these treatments, whatever the implementation chosen, and as shown by the final step S7 of FIG. 1, the result is the thin layer 1 transferred to the carrier substrate 5. The thin layer 1 exhibits an improved surface state with respect to a thin layer 1 obtained directly after splitting using a process of the prior art. In particular, it exhibits a relatively low roughness by virtue of the smoothing effect of the finishing step S5. It also exhibits little or no non-uniformity due to interactions of the splitting wave with acoustic waves that propagate through the receiver substrate 5 and through the donor substrate 2 when they are completely detached from one another by the propagation of the splitting wave. Damage to the thin layer 1 caused by impacts between the two substrates or the relative sliding thereof over one another is also limited.

Of course, the present disclosure is not limited to the described implementations and variants thereof may fall within the scope of the invention as defined by the claims.

In particular, other steps in addition to those described may be envisaged. In particular, these may involve applying additional finishing treatments to the thin layer, for example, a sacrificial oxidation step, or polishing to enhance the qualities of this layer or to adjust its thickness.

It is also possible to combine the two implementations presented, and perform the finishing step S5 in a first phase, between the separating step S4 and the detaching step S6 via a first heat treatment, and supplement this treatment with a second phase, for example, a second heat treatment, applied to the thin layer 1 after the detaching step S6.

The invention claimed is:

1. A method for preparing a thin layer, comprising the following steps:
    a weakening step comprising the introduction of light species through a main face of a donor substrate, the weakening step forming a weakened zone in a central portion of the donor substrate to define the thin layer with the main face of the donor substrate, the weakened zone not extending into a peripheral portion of the donor substrate;
    a joining step comprising joining the main face of the donor substrate to a receiver substrate to form an assembly to be split, the central portion and the peripheral portion of the main face of the donor substrate being brought into contact with a face of the receiver substrate;
    a separating step comprising separating the assembly to be split by application of a heat treatment resulting in the initiation and propagation of a splitting wave in the weakened zone to free the thin layer from the donor substrate at the central portion thereof only, the splitting wave not propagating completely through the peripheral portion such that the donor substrate and the receiver substrate remain attached to one another at the peripheral portion of the donor substrate; and
    a detaching step distinct from the separating step and applied after the separating step, the detaching step comprising treating of the assembly to be split to detach the peripheral portion of the donor substrate from the receiver substrate and thus transfer the thin layer to the receiver substrate.

2. The method of claim 1, further comprising a finishing step including a heat treatment to bring the assembly to be split to a temperature higher than the temperature of the heat treatment of the separating step to smooth the freed surface of the thin layer.

3. The method of claim 2, wherein the finishing step is applied between the separating step and the detaching step.

4. The method of claim 3, wherein the finishing step includes a heat treatment exposing the donor substrate to a temperature lower than 1000° C.

5. The method of claim 2, wherein the separating step and the finishing step are carried out in one and the same apparatus.

6. The method of claim 2, wherein the separating step and the finishing step are carried out in distinct apparatuses.

7. The method of claim 1, wherein the finishing step is applied after the detaching step.

8. The method of claim 1, wherein the donor substrate is a wafer of circular shape and the peripheral portion is an annular portion, and a width of the annular portion taken from the edge of the substrate is between 1 mm and 5 cm.

9. The method of claim 1, wherein the donor substrate comprises a peripheral chamfer on a side of the donor substrate comprising a main-face of the donor substrate, and the peripheral portion extends from the chamfer over a width of between 1 mm and 5 cm.

10. The method of claim 1, wherein the light species are chosen from among the group consisting of hydrogen and helium.

11. The method of claim 1, wherein the donor substrate comprises monocrystalline silicon.

12. The method of claim 1, wherein the separating step comprises a heat treatment exposing the donor substrate to a temperature of between 250° C. and 500° C.

13. The method of claim 1, wherein the detaching step comprises chemical etching or application of a mechanical force to separate the receiver substrate and the donor substrate.

14. The method of claim 4, wherein the heat treatment of the finishing step exposes the donor substrate to a temperature lower than 900° C.

15. The method of claim 14, wherein the heat treatment of the finishing step exposes the donor substrate to a temperature lower than 600° C.

16. The method of claim 4, wherein the separating step and the finishing step are carried out in one and the same apparatus.

17. The method of claim 4, wherein the separating step and the finishing step are carried out in distinct apparatuses.

18. The method of claim 4, wherein the donor substrate comprises monocrystalline silicon.

19. The method of claim 4, wherein the separating step comprises a heat treatment exposing the donor substrate to a temperature of between 250° C. and 500° C.

20. The method of claim 4, wherein the detaching step comprises chemical etching or application of a mechanical force to separate the receiver substrate and the donor substrate.

* * * * *